(12) United States Patent
Yamanaka et al.

(10) Patent No.: US 11,375,615 B2
(45) Date of Patent: Jun. 28, 2022

(54) SUBSTRATE FOR PRINTED CIRCUIT BOARD, PRINTED CIRCUIT BOARD, AND METHOD FOR PRODUCING SUBSTRATE FOR PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Koka (JP); SUMITOMO ELECTRIC FINE POLYMER, INC., Osaka (JP)

(72) Inventors: Yuichiro Yamanaka, Osaka (JP); Yoshio Oka, Osaka (JP); Satoshi Kiya, Koka (JP); Yoshifumi Uchita, Koka (JP); Makoto Nakabayashi, Osaka (JP)

(73) Assignees: Sumitomo Electric Industries, Ltd., Osaka (JP); Sumitomo Electric Printed Circuits, Inc., Koka (JP); Sumitomo Electric Fine Polymer, Inc., Osaka (JP)

( * ) Notice: Subject to any disclaimer, the term of this patent is extended or adjusted under 35 U.S.C. 154(b) by 456 days.

(21) Appl. No.: 15/753,017

(22) PCT Filed: Aug. 6, 2016

(86) PCT No.: PCT/JP2016/073212
§ 371 (c)(1),
(2) Date: Feb. 15, 2018

(87) PCT Pub. No.: WO2017/033713
PCT Pub. Date: Mar. 2, 2017

(65) Prior Publication Data
US 2018/0242450 A1 Aug. 23, 2018

(30) Foreign Application Priority Data
Aug. 21, 2015 (JP) ............................. JP2015-164234

(51) Int. Cl.
*H05K 3/38* (2006.01)
*H05K 1/03* (2006.01)
(Continued)

(52) U.S. Cl.
CPC .......... *H05K 1/0346* (2013.01); *B32B 15/08* (2013.01); *B32B 15/088* (2013.01); *H05K 3/381* (2013.01);
(Continued)

(58) Field of Classification Search
CPC .............................. H05K 1/0346; H05K 3/381
(Continued)

(56) References Cited

U.S. PATENT DOCUMENTS

| | | | | |
|---|---|---|---|---|
| 2005/0121229 A1* | 6/2005 | Takai | ...................... | B32B 15/20 174/261 |
| 2005/0202261 A1* | 9/2005 | Takai | ...................... | H05K 3/28 428/458 |

(Continued)

FOREIGN PATENT DOCUMENTS

| | | |
|---|---|---|
| CN | 104603333 A | 5/2015 |
| JP | H09-136378 A | 5/1997 |

(Continued)

*Primary Examiner* — Archene A Turner
(74) *Attorney, Agent, or Firm* — Faegre Drinker Biddle & Reath LLP (57) ABSTRACT

A substrate for a printed circuit board according to an embodiment of the present invention includes a base film and a metal layer disposed on at least one of surfaces of the base film. In the substrate for a printed circuit board, an amount of nitrogen present per unit area, the amount being determined on the basis of a peak area of a N1s spectrum in XPS analysis of a surface of the base film exposed after removal of the metal layer by etching with an acidic solution, is 1 atomic % or more and 10 atomic % or less.

7 Claims, 2 Drawing Sheets

(51) Int. Cl.
*B32B 15/08* (2006.01)
*B32B 15/088* (2006.01)

(52) U.S. Cl.
CPC ..... *H05K 3/389* (2013.01); *H05K 2201/0154* (2013.01); *H05K 2201/0355* (2013.01)

(58) Field of Classification Search
USPC ........................................................ 428/446
See application file for complete search history.

(56) References Cited

U.S. PATENT DOCUMENTS

| | | | | |
|---|---|---|---|---|
| 2007/0196675 | A1* | 8/2007 | Hashimoto | ............. B32B 15/08 428/458 |
| 2010/0203324 | A1* | 8/2010 | Iizumi | ................... B32B 27/281 428/336 |
| 2011/0189501 | A1* | 8/2011 | Fujisawa | ................. C25D 3/565 428/623 |
| 2015/0079415 | A1* | 3/2015 | Fukuchi | .................. C23C 22/83 428/552 |
| 2016/0250830 | A1 | 9/2016 | Kiya et al. | |

FOREIGN PATENT DOCUMENTS

| | | | |
|---|---|---|---|
| JP | 2008-63560 | A | 3/2008 |
| JP | 2014-111824 | A | 6/2014 |
| JP | 2015-065388 | A | 4/2015 |
| JP | 2015-097257 | A | 5/2015 |
| JP | 2015-115422 | A | 6/2015 |
| WO | WO 2008/004520 | A1 | 1/2008 |
| WO | WO 2011/122645 | A1 | 10/2011 |

\* cited by examiner

SUBSTRATE FOR PRINTED CIRCUIT BOARD, PRINTED CIRCUIT BOARD, AND METHOD FOR PRODUCING SUBSTRATE FOR PRINTED CIRCUIT BOARD

TECHNICAL FIELD

The present invention relates to a substrate for a printed circuit board, a printed circuit board, and a method for producing a substrate for a printed circuit board. The present application claims priority to Japanese Patent Application No. 2015-164234 filed Aug. 21, 2015, and the entire contents of the Japanese application are incorporated herein by reference.

BACKGROUND ART

In recent years, with the realization of electronic devices having a smaller size and higher performance, there has been a need for a higher density of printed circuit boards. In such a printed circuit board having a higher density, with a miniaturization of a metal pattern, the metal pattern tends to be separated from a base film. In view of this, as a substrate for a printed circuit board that meets such a need for a higher density, there has been a demand for a substrate for a printed circuit board, the substrate having good adhesiveness between a metal layer and a base film.

In order to meet the demand, a substrate for a printed circuit board has been proposed in which a thin copper layer is formed on a heat-resisting insulating base film without providing an adhesive layer therebetween (refer to Japanese Unexamined Patent Application Publication No. 9-136378). In this existing substrate for a printed circuit board, a thin copper layer having a thickness of 0.25 to 0.30 µm is formed on each of two surfaces of a heat-resisting insulating base film by sputtering, and a thick copper layer is formed on each of the thin copper layers by electroplating.

CITATION LIST

Patent Literature

PTL 1: Japanese Unexamined Patent Application Publication No. 9-136378

SUMMARY OF INVENTION

A substrate for a printed circuit board according to an embodiment of the invention is a substrate for a printed circuit board, the substrate including a base film and a metal layer disposed on at least one of surfaces of the base film. In the substrate for a printed circuit board, an amount of nitrogen present per unit area, the amount being determined on the basis of a peak area of a N1s spectrum in XPS analysis of a surface of the base film exposed after removal of the metal layer by etching with an acidic solution, is 1 atomic % or more and 10 atomic % or less.

A printed circuit board according to another embodiment of the invention is a printed circuit board including a base film and a metal pattern disposed on at least one of surfaces of the base film. In the printed circuit board, an amount of nitrogen present per unit area, the amount being determined on the basis of a peak area of a N1s spectrum in XPS analysis of a surface of the base film exposed after removal of the metal pattern by etching with an acidic solution, is 1 atomic % or more and 10 atomic % or less. Note that, regarding a polyimide, the amount of nitrogen present is assumed to be a value determined by subtracting an amount of nitrogen present per unit area determined on the basis of a peak area of a N1s spectrum in XPS analysis of the non-treated polyimide alone. When the value obtained by the subtraction is a negative value, the amount of nitrogen present is assumed to be 0%.

A method for producing a substrate for a printed circuit board according to still another embodiment of the invention is a method for producing a substrate for a printed circuit board, the method including a step of applying a coupling agent containing nitrogen to one of surfaces of a metal layer, a step of stacking a base film on the surface of the metal layer, the surface having the coupling agent applied thereto, and a step of hot-pressing a stacked body of the metal layer and the base film.

DESCRIPTION OF EMBODIMENTS

Technical Problem

The substrate for a printed circuit board that has been proposed in the above patent application publication satisfies the requirement for high-density printed circuits in that adhesion strength between the base film and each of the metal layers can be increased. However, in the existing substrate for a printed circuit board, the thin copper layers are formed by sputtering in order to make the metal layers closely adhere to the base film. Therefore, vacuum equipment is necessary, which may result in an increase in the costs of, for example, installation, maintenance, and operation of the equipment. As a result, the production cost of the substrate for a printed circuit board increases.

The present invention has been made under the circumstances described above. An object of the present invention is to provide a substrate for a printed circuit board, a printed circuit board, and a method for producing a substrate for a printed circuit board that enable an improvement in adhesion strength between a metal layer and a base film at a low cost.

As a result of extensive studies to solve the problems described above, the inventors found that the presence of nitrogen between a base film and a metal layer of a substrate for a printed circuit board improves adhesion strength therebetween and that an increase in the amount of this nitrogen present tends to increase the adhesion strength. On the basis of this finding, the inventors found that the metal layer can be caused to closely adhere to the base film by controlling the amount of nitrogen present between the base film and the metal layer without using vacuum equipment.

Advantageous Effects of the Disclosure

The substrate for a printed circuit board and the printed circuit board according to the present invention enable an improvement in adhesion strength between the metal layer and the base film at a low cost. The method for producing a substrate for a printed circuit board according to the present invention realizes production of a substrate for a printed circuit board at a low cost, the substrate having high adhesion strength between the metal layer and the base film.

DESCRIPTION OF EMBODIMENTS OF THE INVENTION

A substrate for a printed circuit board according to an embodiment of the present invention is a substrate for a printed circuit board, the substrate including a base film and a metal layer disposed on at least one of surfaces of the base film. In the substrate for a printed circuit board, an amount of nitrogen present per unit area, the amount being determined on the basis of a peak area of a N1s spectrum in X-ray photoelectron spectroscopy (XPS) analysis of a surface of the base film exposed after removal of the metal layer by etching with an acidic solution, is 1 atomic % or more and 10 atomic % or less.

In the substrate for a printed circuit board, nitrogen is present between the base film and the metal layer. Accordingly, a resin constituting the base film is partially decomposed and turned into radicals by the heating temperature during hot pressing, thereby forming a C—N bond between carbon in the resin and nitrogen between the base film and the metal layer. That is, in the substrate for a printed circuit board, since the amount of nitrogen present on a surface of the base film exposed after removal of the metal layer by etching with an acidic solution is within the above range, such a C—N bond is formed on the surface of the base film in a predetermined amount or more, and high adhesion strength is achieved between the base film and the metal layer. Furthermore, in the substrate for a printed circuit board, the adhesion strength between the base film and the metal layer is reliably obtained as long as nitrogen is present at least between the base film and the metal layer. Therefore, expensive vacuum equipment used for physical vapor deposition such as sputtering is not necessary, and the production cost can be reduced.

An amount of silicon present per unit area, the amount being determined on the basis of a peak area of a Si2p spectrum in XPS analysis of the exposed surface of the base film, is preferably 1 atomic % or more and 10 atomic % or less. Since nitrogen in the C—N bond has a high bonding strength to silicon, and furthermore, this silicon easily bonds to the metal layer with oxygen therebetween. Therefore, silicon present in an amount within the above range enables the adhesion strength between the base film and the metal layer to further improve.

The upper limit of a ratio of the amount of silicon present per unit area to the amount of nitrogen present per unit area of the exposed surface of the base film is preferably 4. When the ratio of the amount of silicon present to the amount of nitrogen present is the upper limit or less, the adhesion strength due to the presence of nitrogen can be improved without making the amount of silicon added excessively large. Thus, the adhesion strength can be easily improved while suppressing an increase in the production cost.

A coupling agent containing nitrogen or a group derived from the coupling agent is preferably present in the vicinity of an interface between the base film and the metal layer. When a coupling agent containing nitrogen or a group derived from the coupling agent is present in the vicinity of the interface, the C—N bond can be easily formed to further improve the adhesion strength between the base film and the metal layer.

The coupling agent is preferably a silane coupling agent. Use of a silane coupling agent facilitates bonding between the metal layer and nitrogen in the C—N bond with silicon therebetween and thus improves the adhesion strength between the base film and the metal layer more easily.

A surface of the metal layer, the surface being disposed on the base film side, preferably has a ten-point average roughness Rz of 0.01 µm or more and 5.0 µm or less. When the ten-point average roughness Rz of the surface of the metal layer, the surface being disposed on the base film side, is within the above range, it is possible to provide a printed circuit board in which the transmission delay and transmission loss in a metal pattern are low and which has good high-frequency characteristics and circuit formability.

The base film preferably contains a fluororesin as a main component. Use of a base film containing a fluororesin as a main component easily decreases the dielectric constant of the base film. Accordingly, the transmission delay and transmission loss in the metal layer are easily reduced.

A printed circuit board according to another embodiment of the present invention is a printed circuit board including a base film and a metal pattern disposed on at least one of surfaces of the base film. In the printed circuit board, an amount of nitrogen present per unit area, the amount being determined on the basis of a peak area of a N1s spectrum in XPS analysis of a surface of the base film exposed after removal of the metal pattern by etching with an acidic solution, is 1 atomic % or more and 10 atomic % or less.

Since the printed circuit board is obtained by using the above-described substrate for a printed circuit board, the printed circuit board has high adhesion strength between the base film and the metal pattern and can be produced at a low cost.

A method for producing a substrate for a printed circuit board according to still another embodiment of the present invention is a method for producing a substrate for a printed circuit board, the method including a step of applying a coupling agent containing nitrogen to one of surfaces of a metal layer, a step of stacking a base film on the surface of the metal layer, the surface having the coupling agent applied thereto, and a step of hot-pressing a stacked body of the metal layer and the base film.

The method for producing a substrate for a printed circuit board includes hot-pressing a stacked body obtained by stacking a base film on a surface of a metal layer, the surface having a coupling agent applied thereto. Accordingly, a resin constituting the base film is partially decomposed and turned into radicals by the heating temperature during this hot pressing, thereby forming a C—N bond between carbon in the resin and nitrogen between the base film and the metal layer. Accordingly, use of the method for producing a substrate for a printed circuit board can provide a substrate for a printed circuit board, the substrate having a high adhesion strength between the base film and the metal layer. Furthermore, the method for producing a substrate for a printed circuit board can be performed by applying a coupling agent containing nitrogen, and subsequently performing hot-pressing. Therefore, expensive vacuum equipment used for physical vapor deposition such as sputtering is not necessary, and the production cost can be reduced.

Herein, the term "vicinity of the interface" refers to a region near the interface between the base film and the metal layer and means, for example, a region extending to 500 nm or less from the interface between the base film and the metal layer. The term "group derived from the coupling agent" refers to a group formed by removing at least one organic functional group, hydrolyzable group, or the like from the coupling agent. The term "ten-point average roughness (Rz)" refers to a value measured in accordance with JIS-B0601: 2013 where the evaluation length (l) is 3.2 mm and the cut-off value ($\lambda c$) is 0.8 mm. The term "main component" refers to a component that has the highest content and, for example, a component having a content of 50% by mass or more.

Details of Embodiments of the Invention

A substrate for a printed circuit board, a printed circuit board, and a method for producing a substrate for a printed circuit board according to embodiments of the present invention will now be described with reference to the drawings.

[Substrate for Printed Circuit Board]

Figure 1:
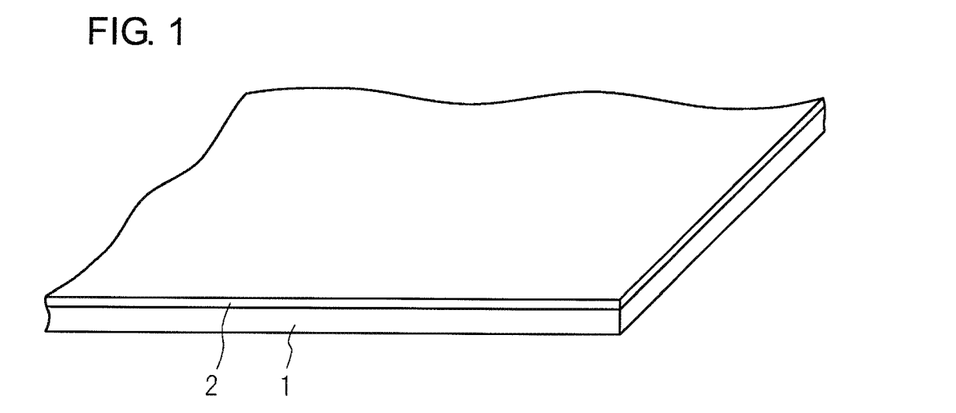
FIG. 1 is a schematic perspective view of a substrate for a printed circuit board according to an embodiment of the present invention.

A substrate for a printed circuit board in FIG. 1 includes a base film 1 and a metal layer 2 disposed on one of surfaces of the base film 1. Furthermore, nitrogen is present in the vicinity of the interface between the base film 1 and the metal layer 2.

<Base Film>

The base film 1 included in the substrate for a printed circuit board has an insulating property. Examples of the material of the base film 1 include polyethylene terephthalate (PET), polyimides (PI), and fluororesins. Herein, the term "fluororesin" refers to a resin in which at least one hydrogen atom bonded to a carbon atom that forms a repeating unit of a polymer chain is substituted with a fluorine atom or an organic group having a fluorine atom (hereinafter, may be referred to as a "fluorine atom-containing group"). The fluorine atom-containing group is a group in which at least one hydrogen atom in a linear or branched organic group is substituted with a fluorine atom. Examples of the fluorine atom-containing group include fluoroalkyl groups, fluoroalkoxy groups, and fluoropolyether groups. Examples of the fluororesins include tetrafluoroethylene-hexafluoropropylene copolymers (FEP), polytetrafluoroethylene (PTFE), tetrafluoroethylene-perfluoroalkyl vinyl ether copolymers (PFA), ethylene-tetrafluoroethylene copolymers (ETFE), polyvinylidene fluoride (PVDF), polychlorotrifluoroethylene (PCTFE), ethylene-chlorotrifluoroethylene copolymers (ECTFE), polyvinyl fluoride (PVF), fluoroelastomers, and fluorothermoplastics (THV) obtained from three monomers of tetrafluoroethylene, hexafluoropropylene, and vinylidene fluoride. Of these fluororesins, for example, FEP, PFA, and PTFE are preferred from the viewpoint of heat resistance.

The thickness of the base film 1 is determined in accordance with a printed circuit board produced by using the substrate for a printed circuit board, and the thickness is not particularly limited. For example, the lower limit of the average thickness of the base film 1 is preferably 5 µm and more preferably 12 µm. The upper limit of the average thickness of the base film 1 is preferably 2 mm and more preferably 1.6 mm. When the average thickness of the base film 1 is less than the lower limit, the base film 1 may have insufficient strength. On the other hand, when the average thickness of the base film 1 exceeds the upper limit, a reduction in the thickness of the resulting printed circuit board may become difficult to achieve.

<Metal Layer>

The metal layer 2 is disposed on one of surfaces of the base film 1 as illustrated in FIG. 1.

A main component of the metal layer 2 is preferably a metal having high conductivity. Examples of the metal include copper, nickel, aluminum, gold, silver, and alloys thereof. Of these, copper or a copper alloy is preferred as a metal having good conductivity and having good adhesiveness to the base film 1.

The lower limit of the average thickness of the metal layer 2 is preferably 0.05 µm and more preferably 0.1 µm. The upper limit of the average thickness of the metal layer 2 is preferably 2 µm and more preferably 1.5 µM. When the average thickness of the metal layer 2 is less than the lower limit, the metal layer 2 may be easily damaged. On the other hand, when the average thickness of the metal layer 2 exceeds the upper limit, a reduction in the thickness of the resulting printed circuit board may become difficult to achieve.

The lower limit of the ten-point average roughness Rz of a surface of the metal layer 2, the surface being disposed on the base film 1 side, is preferably 0.01 µm and more preferably 0.05 µm. The upper limit of the ten-point average roughness Rz is preferably 5.0 µm and more preferably 3.0 µm. When the ten-point average roughness Rz is less than the lower limit, the production cost of the printed circuit board may be increased. On the other hand, when the ten-point average roughness Rz exceeds the upper limit, a decrease in the transmission rate and an increase in the transmission loss may be caused by the skin effect.

A rust-proofing layer may be formed on a surface of the metal layer 2. The rust-proofing layer suppresses a decrease in the adhesion strength due to oxidation of the surface of the metal layer 2. The rust-proofing layer preferably contains cobalt, chromium, or copper and more preferably contains cobalt or a cobalt alloy as a main component. The rust-proofing layer may be formed as a single layer or a plurality of layers. The rust-proofing layer may be formed as a plating layer. This plating layer is formed as a single-metal plating layer or an alloy plating layer. The metal constituting the single-metal plating layer is preferably cobalt. Examples of the alloy constituting the alloy plating layer include cobalt alloys such as cobalt-molybdenum, cobalt-nickel-tungsten, and cobalt-nickel-germanium.

(Interface Between Base Film and Metal Layer)

Nitrogen is present in the vicinity of the interface between the base film 1 and the metal layer 2. Since this nitrogen forms a C—N bond with carbon in the resin constituting the base film 1, the presence of this nitrogen provides high adhesion strength between the metal layer 2 and the base film 1.

The amount of nitrogen present in the vicinity of the interface can be determined by the amount of nitrogen present per unit area of a surface of the base film 1 exposed after removal of the metal layer 2 by etching with an acidic solution. The amount of nitrogen present per unit area can be determined on the basis of a peak area of a N1s spectrum by using an X-ray photoelectron spectrometer that irradiates a surface of the base film 1 with X-rays and analyzes kinetic energy of photoelectrons emitted from the surface of the base film.

The lower limit of the amount of nitrogen present per unit area determined as described above is 1 atomic %, preferably 3 atomic %, and more preferably 5 atomic %. The upper limit of the amount of nitrogen present per unit area is 10 atomic %, preferably 9 atomic %, and more preferably 8 atomic %. When the amount of nitrogen present per unit area is less than the lower limit, the number of C—N bonds formed on the surface of the base film 1 is small, and thus predetermined adhesion strength is not obtained between the base film 1 and the metal layer 2, and the metal layer 2 may become easily separated. On the other hand, when the amount of nitrogen present per unit area exceeds the upper limit, the production cost of the substrate for a printed circuit board may become excessively high in order to increase the amount of nitrogen present.

In addition to nitrogen, silicon is preferably present in the vicinity of the interface between the base film 1 and the metal layer 2. When silicon is present in the vicinity of the interface, nitrogen that forms the C—N bond easily bonds to oxygen in the metal layer 2 with the silicon therebetween to enhance the effect of improving adhesion strength due to the presence of nitrogen.

The amount of silicon present in the vicinity of the interface can be determined by the amount of silicon present per unit area of a surface of the base film 1 exposed after removal of the metal layer 2 by etching with an acidic solution. The amount of silicon present per unit area can be determined by a method similar to the above-described method for determining the amount of nitrogen present per unit area. Specifically, the amount of silicon present per unit area can be determined on the basis of a peak area of a Si2p spectrum by using an X-ray photoelectron spectrometer.

The lower limit of the amount of silicon present per unit area determined as described above is preferably 1 atomic % and more preferably 3.5 atomic %. The upper limit of the amount of silicon present per unit area is preferably 10 atomic % and more preferably 5.5 atomic %. When the amount of silicon present per unit are is less than the lower limit, the effect of improving adhesion strength due to the presence of nitrogen may not be sufficiently enhanced. On the other hand, when the amount of silicon present per unit are exceeds the upper limit, the amount of silicon added becomes excessively increased relative to the improvement in adhesion strength due to the presence of nitrogen. Therefore, the production cost of the substrate for a printed circuit board may be increased.

The lower limit of a ratio of the amount of silicon present per unit area to the amount of nitrogen present per unit area in the XPS analysis is preferably 0.1 and more preferably 0.3. The upper limit of the ratio is preferably 4 and more preferably 1.5. When the ratio is less than the lower limit, the improvement effect due to silicon may not be sufficiently obtained relative to adhesion strength obtained by the presence of nitrogen. On the other hand, when the ratio exceeds the upper limit, the amount of silicon added becomes excessive relative to the effect of improving the adhesion strength due to the presence of nitrogen. Therefore, the production cost of the substrate for a printed circuit board may be increased.

An example of a method for causing nitrogen to be present in the vicinity of the interface of the substrate for a printed circuit board is a method in which the base film 1 and the metal layer 2 are laminated with a coupling agent containing nitrogen. Specifically, for example, a coupling agent is applied to a metal foil serving as the metal layer 2, the base film 1 is then stacked on a surface of the metal foil, the surface having the coupling agent applied thereto, and the resulting stacked body is subjected to hot pressing. When the substrate for a printed circuit board is prepared by using a coupling agent containing nitrogen in this manner, the coupling agent containing nitrogen or a group derived from the coupling agent is present in the vicinity of the interface between the base film 1 and the metal layer 2. Herein, the term "group derived from the coupling agent" refers to a group formed by removing at least one organic functional group, hydrolyzable group, or the like from the coupling agent and is, for example, a group formed by removing an alkoxy group from a silane coupling agent having an alkoxy group as a hydrolyzable group.

The coupling agent containing nitrogen is preferably a silane coupling agent. Use of a silane coupling agent enables silicon to be present in the vicinity of the interface between the base film 1 and the metal layer 2 and enables a further improvement in adhesion strength between the base film 1 and the metal layer 2. Examples of the silane coupling agent that can be used include N-2-(aminoethyl)-3-aminopropyl-methyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethylbutylidene) propylamine, N-phenyl-3-aminopropyltrimethoxysilane, N-(vinylbenzyl)-2-aminoethyl-3-aminopropyltrimethoxysilane hydrochloride, and γ-aminopropyltrimethoxysilane.

The metal layer 2 to which the coupling agent is applied may be a commercially available metal foil or a metal layer prepared by separating a thin metal film formed on a substrate by a known method such as electroplating, electroless plating, sputtering, physical vapor deposition (PVD), or chemical vapor deposition (CVD).

As another method for causing nitrogen to be present in the vicinity of the interface of the substrate for a printed circuit board, an oxygen plasma treatment may be employed. Specifically, for example, a surface of the base film 1 is subjected to an oxygen plasma treatment to introduce oxygen element (carbonyl group), and a nucleophilic addition reaction is then caused to this carbonyl group with a primary amine to introduce nitrogen on the surface of the base film 1. Subsequently, the base film 1 in which nitrogen is introduced and the metal layer 2 are stacked. Thus, nitrogen can be caused to be present in the vicinity of the interface of the substrate for a printed circuit board.

The lower limit of a peel strength between the metal layer 2 and the base film 1 is preferably 0.5 N/cm, more preferably 2 N/cm, and still more preferably 5 N/cm. When the peel strength is less than the lower limit, the metal layer 2 may be easily separated. Herein, the term "peel strength" refers to a value measured in accordance with JIS-K6854-2: 1999.

[Method for Producing Substrate for Printed Circuit Board]

A method for producing the substrate for a printed circuit board includes a step of applying a coupling agent containing nitrogen on one of surfaces of a metal layer (coupling agent application step), a step of stacking a base film on a surface of the metal layer, the surface having the coupling agent applied thereto (stacking step), and a step of hot-pressing a stacked body of the metal layer and the base film (hot-pressing step).

<Coupling Agent Application Step>

Figure 2A:
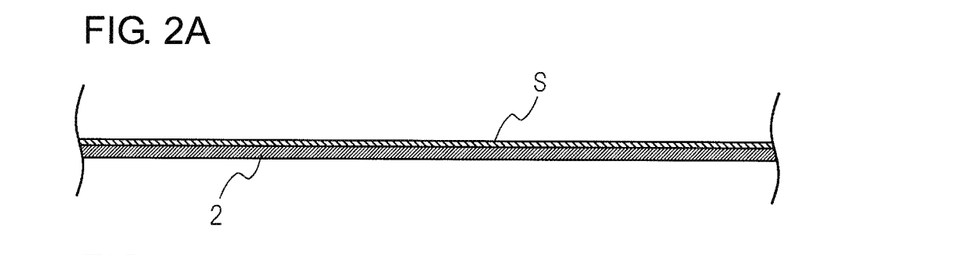
FIG. 2A is a schematic partial sectional view illustrating a coupling agent application step in a method for producing the substrate for a printed circuit board in FIG. 1.

In the coupling agent application step, as illustrated in FIG. 2A, a coupling agent S containing nitrogen is applied to one of surfaces of a metal layer 2 such as a copper foil and dried. The coupling agent S can be applied by using a known method such as spray coating, coater coating, dipping, or pouring.

The lower limit of the amount of the coupling agent S applied is preferably 0.1 mg/m$^2$ and more preferably 1 mg/m$^2$. The upper limit of the amount of the coupling agent S applied is preferably 30 mg/m$^2$ and more preferably 8 mg/m$^2$. When the amount of the coupling agent S applied is less than the lower limit, the effect of improving adhesion strength due to the coupling agent S may not be sufficiently obtained. On the other hand, when the amount of the coupling agent S applied exceeds the upper limit, the cohesive force of the coupling agent S may decrease, and the resulting coating film may be easily separated.

<Stacking Step>

Figure 2B:
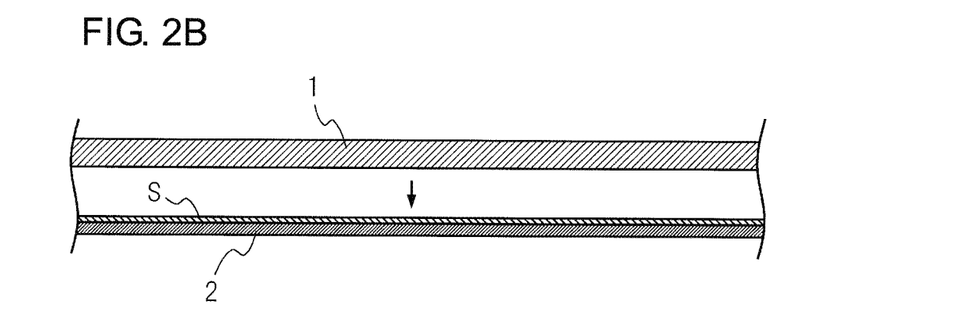
FIG. 2B is a schematic partial sectional view illustrating a step in the method for producing the substrate for a printed circuit board in FIG. 1, the step being performed subsequent to the step illustrated in FIG. 2A.

In the stacking step, as illustrated in FIG. 2B, a base film 1 is stacked on the surface of the metal layer 2, the surface having the coupling agent S applied thereto.

<Hot-Pressing Step>

Figure 2C:
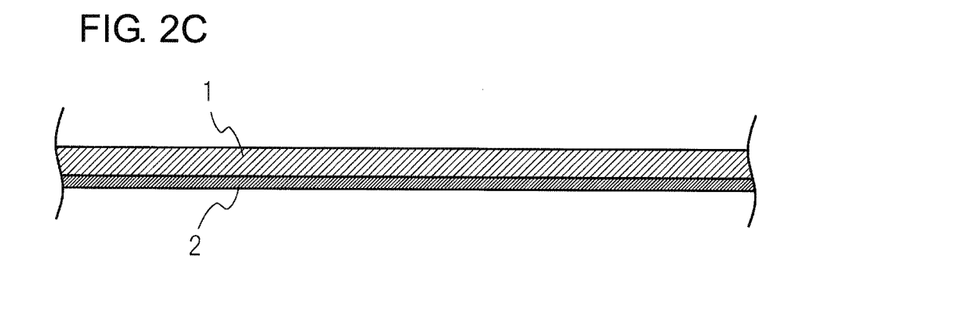
FIG. 2C is a schematic partial sectional view illustrating a step in the method for producing the substrate for a printed circuit board in FIG. 1, the step being performed subsequent to the step illustrated in FIG. 2B.

In the hot-pressing step, as illustrated in FIG. 2C, the resulting stacked body of the metal layer 2 and the base film 1 is subjected to hot pressing to bond the metal layer 2 and the base film 1 to each other. A resin constituting the base film 1 is partially decomposed and turned into radicals by the heating temperature during this hot pressing, thereby forming a C—N bond between carbon in the resin and nitrogen contained in the coupling agent or a group derived from the coupling agent.

The lower limit of the heating temperature during the hot pressing is preferably 150° C. and more preferably 160° C. The upper limit of the heating temperature is preferably 500° C. and more preferably 450° C. When the heating temperature is less than the lower limit, the generation of the radicals becomes insufficient, and adhesion strength between the metal layer 2 and the base film 1 may decrease. On the other hand, when the heating temperature exceeds the upper limit, the base film 1 may be degraded.

The lower limit of the pressure during the hot pressing is preferably 0.8 MPa and more preferably 1.0 MPa. The upper limit of the pressure is preferably 8 MPa and more preferably 3 MPa. When the pressure is less than the lower limit, the metal layer 2 and the base film 1 are not satisfactorily bonded to each other, and predetermined adhesion strength may not be obtained. On the other hand, when the pressure exceeds the upper limit, the shear stress applied in the plane direction is increased at the interface between the base film 1 and the metal layer 2, and thus it may become difficult to maintain a satisfactory bonding state during the pressing.

The lower limit of the pressing time during the hot pressing is preferably 1 minute and more preferably 10 minutes. The upper limit of the pressing time is preferably 1.5 hours and more preferably 1 hour. When the pressing time is less than the lower limit, sufficient adhesion strength between the metal layer 2 and the base film 1 may not be obtained. On the other hand, when the pressing time exceeds the upper limit, the base film 1 may be degraded.

[Printed Circuit Board]

Figure 3A:
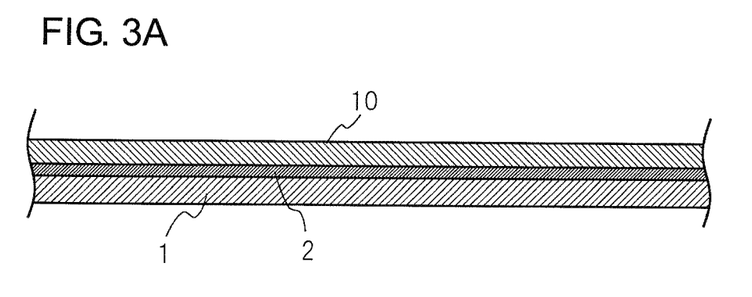
FIG. 3A is a schematic partial sectional view illustrating a resist coating step in a method for producing a printed circuit board using the substrate for a printed circuit board in FIG. 1.
Figure 3B:
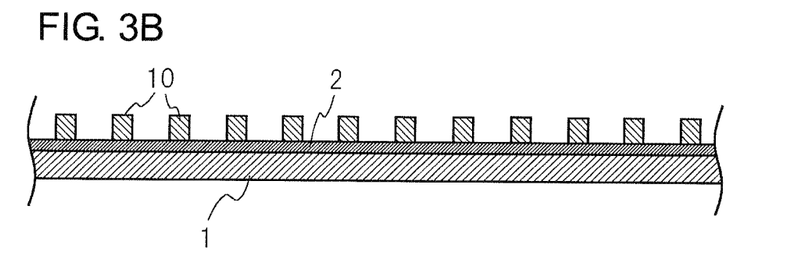
FIG. 3B is a schematic partial sectional view illustrating a step in the method for producing a printed circuit board using the substrate for a printed circuit board in FIG. 1, the step being performed subsequent to the step illustrated in FIG. 3A.
Figure 3C:
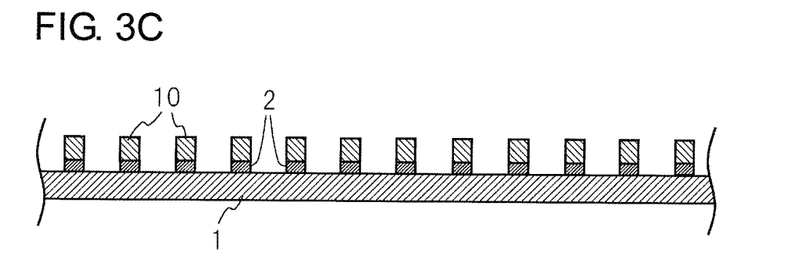
FIG. 3C is a schematic partial sectional view illustrating a step in the method for producing a printed circuit board using the substrate for a printed circuit board in FIG. 1, the step being performed subsequent to the step illustrated in FIG. 3B.
Figure 3D:
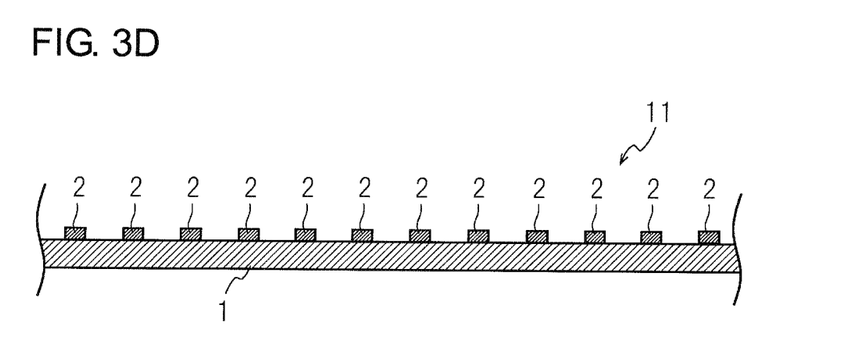
FIG. 3D is a schematic partial sectional view illustrating a step in the method for producing a printed circuit board using the substrate for a printed circuit board in FIG. 1, the step being performed subsequent to the step illustrated in FIG. 3C.

The printed circuit board includes a base film 1 and a metal pattern 11 disposed on one of surfaces of the base film 1, as illustrated in FIG. 3D. Since the printed circuit board is formed by using the substrate for a printed circuit board, the amount of nitrogen present per unit area determined on the basis a peak area of a N1s spectrum in XPS analysis of a surface of the base film 1 exposed after removal of the metal pattern 11 by etching with an acidic solution is 1 atomic % or more and 10 atomic % or less. Note that, regarding a polyimide, the amount of nitrogen present is assumed to be a value determined by subtracting an amount of nitrogen present per unit area determined on the basis of a peak area of a N1s spectrum in XPS analysis of the polyimide alone. When the value obtained by the subtraction is a negative value, the amount of nitrogen present is assumed to be 0%.

[Method for Producing Printed Circuit Board]

Next, a description will be made of an embodiment of a method for producing the printed circuit board using the above substrate for a printed circuit board. Here, the case where a metal pattern is formed by a subtractive method will be described.

First, as illustrated in FIG. 3A, a photosensitive resist 10 is formed so as to cover one of surfaces of the substrate for a printed circuit board prepared to have a predetermined size. Subsequently, as illustrated in FIG. 3B, the resist 10 is patterned so as to correspond to a metal pattern by, for example, exposure and development. Subsequently, as illustrated in FIG. 3C, portions of the metal layer 2 other than the metal pattern are removed by etching using the resist 10 as a mask. Lastly, as illustrated in FIG. 3D, the remaining resist 10 is removed to provide a printed circuit board including the base film 1 having a metal pattern 11 thereon.

Here, the description has been made of the method for producing a printed circuit board, the method including forming a circuit by the subtractive method. Alternatively, the printed circuit board can be produced by forming a circuit by another known production method such as a semi-additive method. Since the printed circuit board is produced by using the above-described substrate for a printed circuit board, the printed circuit board has high adhesion strength between the base film 1 and the metal layer 2, and thus the metal pattern 11 is unlikely to separate from the base film 1.

[Advantages]

According to the substrate for a printed circuit board, since nitrogen is present between a base film and a metal layer, a C—N bond is formed between the nitrogen and carbon in a resin constituting the base film. With this structure, the substrate for a printed circuit board has high adhesion strength between the base film and the metal layer.

Furthermore, since the substrate for a printed circuit board can be produced without using expensive vacuum equipment necessary for physical vapor deposition such as sputtering, the substrate for a printed circuit board can be produced at a low cost.

Other Embodiments

It is to be understood that the embodiments disclosed herein are only illustrative and are not restrictive in all respects. The scope of the present invention is not limited to the configurations of the embodiments and is defined by the claims described below. The scope of the present invention is intended to cover all the modifications within the meaning and range of equivalents of the claims.

In the embodiments described above, the metal layer is disposed on one of surfaces of the base film. Alternatively, the substrate may be a double-sided substrate for a printed circuit board, the substrate having the metal layer on each of two surfaces of the base film. In a method for producing such a double-sided substrate for a printed circuit board, a metal layer may be formed on each of two surfaces by a formation method similar to that in the above embodiments. Alternatively, a metal layer may be formed on the other surface of the substrate for a printed circuit board by another method, the substrate being obtained in the above embodiments. For example, a metal layer may be formed by electroplating on the other surface of the substrate for a printed circuit board.

EXAMPLES

Hereinafter, the present invention will be described in more detail by way of Examples. However, the present invention is not limited to the Examples.

No. 1

First, a polyimide (PI) film ("APICAL" available from KANEKA CORPORATION) having an average thickness of 50 μm and serving as a base film and two copper foils, each of which was obtained by forming a rust-proofing layer on each of two surfaces of a copper foil having an average thickness of 17 μm, and applying, as a silane coupling agent, N-2-(aminoethyl)-3-aminopropylmethyldimethoxysilane to a surface of one of the rust-proofing layers, were prepared. Next, one of the copper foils, the PI film, and the other copper foil were stacked in that order such that the surfaces to which the silane coupling agent was applied were located on the PI film side. The resulting stacked body was then subjected to hot pressing with a hot-pressing machine to obtain a substrate for a printed circuit board of No. 1 as an Example. Here, the hot pressing was conducted under the conditions of a pressure of 6.0 MPa, a heating temperature of 320° C., and a pressing time of 40 minutes. Regarding the temperature profile during the hot pressing, the temperature was increased from 25° C. to 320° C. over a period of about 90 minutes, maintained at 320° C. for 40 minutes, and then decreased from 320° C. to 25° C.

No. 2

A substrate for a printed circuit board of No. 2 was obtained as an Example by the same method as that used in the substrate for a printed circuit board of No. 1 except that a polyethylene terephthalate (PET) film ("G2" available from TEIJIN LIMITED) having an average thickness of 50 μm was used as a base film, and the heating temperature and the temperature profile during hot pressing were changed as described below. Here, the heating temperature during hot pressing was 210° C. Regarding the temperature profile during hot pressing, the temperature was increased from 25° C. to 210° C. over a period of about 90 minutes, maintained at 210° C. for 40 minutes, and then decreased from 210° C. to 25° C.

No. 3

A substrate for a printed circuit board of No. 3 was obtained as an Example by the same method as that used in the substrate for a printed circuit board of No. 1 except that a polytetrafluoroethylene (PTFE) film (available from CHU-KOH CHEMICAL INDUSTRIES, LTD.) having an average thickness of 50 μm was used as a base film, 3-aminopropyltriethoxysilane was used as a silane coupling agent, and the heating temperature and the temperature profile during hot pressing were changed as described below. Here, the heating temperature during hot pressing was 400° C. Regarding the temperature profile, the temperature was increased from 25° C. to 400° C. over a period of about 90 minutes, maintained at 400° C. for 40 minutes, and then decreased from 400° C. to 25° C.

No. 4

A substrate for a printed circuit board of No. 4 was obtained as an Example by the same method as that used in the substrate for a printed circuit board of No. 3 except that a tetrafluoroethylene-perfluoroalkyl vinyl ether copolymer (PFA) film ("AF-0050" available from DAIKIN INDUSTRIES, LTD.) having an average thickness of 50 μm was used as a base film, and the heating temperature and the temperature profile during hot pressing were changed as described below. Here, the heating temperature during hot pressing was 300° C. Regarding the temperature profile, the temperature was increased from 25° C. to 300° C. over a period of about 90 minutes, maintained at 300° C. for 40 minutes, and then decreased from 300° C. to 25° C.

No. 5

A substrate for a printed circuit board of No. 5 was obtained as an Example by the same method as that used in the substrate for a printed circuit board of No. 3 except that a tetrafluoroethylene-hexafluoropropylene copolymer (FEP) film ("NF-0050" available from DAIKIN INDUSTRIES, LTD.) having an average thickness of 50 μm was used as a base film, and the heating temperature and the temperature profile during hot pressing were changed as described below. Here, the heating temperature during hot pressing was 320° C. Regarding the temperature profile, the temperature was increased from 25° C. to 320° C. over a period of about 90 minutes, maintained at 320° C. for 40 minutes, and then decreased from 320° C. to 25° C.

No. 6

A substrate for a printed circuit board of No. 6 was obtained as an Example by the same method as that used in the substrate for a printed circuit board of No. 1 except that the pressure during hot pressing was 1.2 MPa.

No. 7

A substrate for a printed circuit board of No. 7 was obtained as an Example by the same method as that used in the substrate for a printed circuit board of No. 2 except that the pressure during hot pressing was 1.2 MPa.

No. 8

A substrate for a printed circuit board of No. 8 was obtained as an Example by the same method as that used in the substrate for a printed circuit board of No. 3 except that the pressure during hot pressing was 1.2 MPa.

No. 9

A substrate for a printed circuit board of No. 9 was obtained as an Example by the same method as that used in the substrate for a printed circuit board of No. 4 except that the pressure during hot pressing was 1.2 MPa.

No. 10

A substrate for a printed circuit board of No. 10 was obtained as an Example by the same method as that used in the substrate for a printed circuit board of No. 5 except that the pressure during hot pressing was 1.2 MPa.

No. 11

A substrate for a printed circuit board of No. 11 was obtained as an Example by the same method as that used in the substrate for a printed circuit board of No. 1 except that the heating temperature during hot pressing was 280° C., and regarding the temperature profile, the temperature was increased from 25° C. to 280° C. over a period of about 90 minutes, maintained at 280° C. for 40 minutes, and then decreased from 280° C. to 25° C.

No. 12

A substrate for a printed circuit board of No. 12 was obtained as an Example by the same method as that used in the substrate for a printed circuit board of No. 2 except that the heating temperature during hot pressing was 170° C., and regarding the temperature profile, the temperature was increased from 25° C. to 170° C. over a period of about 90 minutes, maintained at 170° C. for 40 minutes, and then decreased from 170° C. to 25° C.

No. 13

A substrate for a printed circuit board of No. 13 was obtained as an Example by the same method as that used in the substrate for a printed circuit board of No. 3 except that the heating temperature during hot pressing was 360° C., and regarding the temperature profile, the temperature was increased from 25° C. to 360° C. over a period of about 90 minutes, maintained at 360° C. for 40 minutes, and then decreased from 360° C. to 25° C.

No. 14

A substrate for a printed circuit board of No. 14 was obtained as an Example by the same method as that used in the substrate for a printed circuit board of No. 4 except that the heating temperature during hot pressing was 260° C., and regarding the temperature profile, the temperature was increased from 25° C. to 260° C. over a period of about 90 minutes, maintained at 260° C. for 40 minutes, and then decreased from 260° C. to 25° C.

No. 15

A substrate for a printed circuit board of No. 15 was obtained as an Example by the same method as that used in the substrate for a printed circuit board of No. 5 except that the heating temperature during hot pressing was 280° C., and regarding the temperature profile, the temperature was increased from 25° C. to 280° C. over a period of about 90 minutes, maintained at 280° C. for 40 minutes, and then decreased from 280° C. to 25° C.

No. 16

First, a base film obtained by subjecting a PI film having an average thickness of 50 μm to an oxygen plasma treatment to thereby eliminate fluorine element on surfaces of the PI film and introduce oxygen element (carbonyl group), and subsequently causing a nucleophilic addition reaction to the introduced carbonyl group with a primary amine to thereby introduce nitrogen element, and two copper foils each obtained by forming a rust-proofing layer on each of two surfaces of a copper foil having an average thickness of 17 μm, were prepared. Next, one of the copper foils, the PI film, and the other copper foil were stacked in that order. The resulting stacked body was then subjected to hot pressing with a hot-pressing machine under the same hot-pressing conditions and the same temperature profile as those in No. 1 to obtain a substrate for a printed circuit board of No. 16 as an Example.

No. 17

A substrate for a printed circuit board of No. 17 was obtained as an Example by the same method as that used in the substrate for a printed circuit board of No. 16 except that a PET film which had an average thickness of 50 μm and in which nitrogen element was introduced on surfaces thereof by the same method as that used in No. 16 was used as a base film, and hot pressing was conducted under the same hot-pressing conditions and the same temperature profile as those in No. 2.

No. 18

A substrate for a printed circuit board of No. 18 was obtained as an Example by the same method as that used in the substrate for a printed circuit board of No. 16 except that a PTFE film which had an average thickness of 50 μm and in which nitrogen element was introduced on surfaces thereof by the same method as that used in No. 16 was used as a base film, and hot pressing was conducted under the same hot-pressing conditions and the same temperature profile as those in No. 3.

No. 19

A substrate for a printed circuit board of No. 19 was obtained as an Example by the same method as that used in the substrate for a printed circuit board of No. 16 except that a PFA film which had an average thickness of 50 μm and in which nitrogen element was introduced on surfaces thereof by the same method as that used in No. 16 was used as a base film, and hot pressing was conducted under the same hot-pressing conditions and the same temperature profile as those in No. 4.

No. 20

A substrate for a printed circuit board of No. 20 was obtained as an Example by the same method as that used in the substrate for a printed circuit board of No. 16 except that an FEP film which had an average thickness of 50 μm and in which nitrogen element was introduced on surfaces thereof by the same method as that used in No. 16 was used as a base film, and hot pressing was conducted under the same hot-pressing conditions and the same temperature profile as those in No. 5.

No. 21

A substrate for a printed circuit board of No. 21 was obtained as a Comparative Example by the same method as that used in the substrate for a printed circuit board of No. 1 except that 3-glycidoxypropyltriethoxysilane, which does not contain nitrogen, was used as a silane coupling agent applied to a surface of one of the rust-proofing layers of each of the copper foils.

No. 22

A substrate for a printed circuit board of No. 22 was obtained as a Comparative Example by the same method as that used in the substrate for a printed circuit board of No. 2 except that 3-glycidoxypropyltriethoxysilane, which does not contain nitrogen, was used as a silane coupling agent applied to a surface of one of the rust-proofing layers of each of the copper foils.

No. 23

A substrate for a printed circuit board of No. 23 was obtained as a Comparative Example by the same method as that used in the substrate for a printed circuit board of No. 3 except that 3-glycidoxypropyltriethoxysilane, which does not contain nitrogen, was used as a silane coupling agent applied to a surface of one of the rust-proofing layers of each of the copper foils.

No. 24

A substrate for a printed circuit board of No. 24 was obtained as a Comparative Example by the same method as that used in the substrate for a printed circuit board of No. 4 except that 3-glycidoxypropyltriethoxysilane, which does not contain nitrogen, was used as a silane coupling agent applied to a surface of one of the rust-proofing layers of each of the copper foils.

No. 25

A substrate for a printed circuit board of No. 25 was obtained as a Comparative Example by the same method as that used in the substrate for a printed circuit board of No. 5 except that 3-glycidoxypropyltriethoxysilane, which does not contain nitrogen, was used as a silane coupling agent applied to a surface of one of the rust-proofing layers of each of the copper foils.

<Measurement of Amounts of Nitrogen and Silicon Present>

The copper foils of the substrates for printed circuit boards of Nos. 1 to 25 were removed with an etchant formed of an acidic solution. A surface of each of the base films after the removal of the copper foils was irradiated with X-rays, and the amounts of nitrogen and silicon present on the surface of the base film were measured on the basis of kinetic energy of photoelectrons emitted from the surface of the base film by using an X-ray photoelectron spectrometer ("Quantera SXM" available from ULVAC-PHI, INCORPORATED). Specifically, the amount [atomic %] of nitrogen present per unit area was determined on the basis of the peak area of the N1s spectrum, and the amount [atomic %] of silicon present per unit area was determined on the basis of the peak area of the Si2p spectrum. Table 1 shows the measurement results of the amounts of nitrogen and silicon present. Table 1 also shows the ratio of the amount of silicon present to the amount of nitrogen present (amount of Si present/amount of N present) obtained from these measurements. Regarding Nos. 21 to 25, since the amount of nitrogen present was zero, the ratio of the amounts present is not calculated. Note that, regarding the polyimide, the amount of nitrogen present is assumed to be a value determined by subtracting an amount of nitrogen present per unit area determined on the basis of the peak area of the N1s spectrum in XPS analysis of the polyimide alone. When the value obtained by the subtraction is a negative value, the amount of nitrogen present is assumed to be 0%.

<Evaluation of Adhesion Strength>

For the substrates for printed circuit boards of Nos. 1 to 25, a peel strength (N/cm) between the base film and the copper foil was measured to evaluate the adhesion strength between the base film and the copper foil. The peel strength was measured by the method according to JIS-K6854-2: 1999 "Adhesives-Determination of peel strength of bonded assemblies-Part 2: 180° peel". Table 1 shows the measurement results of the peel strength.

TABLE 1

| No. | Base film material | Coupling agent | Pressure (MPa) | Heating temperature (° C.) | Pressing time (min) | Amount of N present (atomic %) | Amount of Si present (atomic %) | Amount of Si present/ Amount of N present | Peel strength (N/cm) |
|---|---|---|---|---|---|---|---|---|---|
| 1 | PI | N-2-(Aminoethyl)-3-aminopropylmethyldimethoxysilane | 6 | 320 | 40 | 4.3 | 4.3 | 1.00 | 8.1 |
| 2 | PET | N-2-(Aminoethyl)-3-aminopropylmethyldimethoxysilane | 6 | 210 | 40 | 4.6 | 4.9 | 1.07 | 11.3 |
| 3 | PTFE | 3-aminopropyltriethoxysilane | 6 | 400 | 40 | 4.2 | 4.0 | 0.95 | 13.0 |
| 4 | PFA | 3-aminopropyltriethoxysilane | 6 | 300 | 40 | 4.5 | 4.3 | 0.96 | 11.1 |
| 5 | FEP | 3-aminopropyltriethoxysilane | 6 | 320 | 40 | 4.3 | 4.5 | 1.05 | 12.2 |
| 6 | PI | N-2-(Aminoethyl)-3-aminopropylmethyldimethoxysilane | 1.2 | 320 | 40 | 9.4 | 4.7 | 0.50 | 9.1 |
| 7 | PET | N-2-(Aminoethyl)-3-aminopropylmethyldimethoxysilane | 1.2 | 210 | 40 | 9.5 | 4.6 | 0.48 | 15.2 |
| 8 | PTFE | 3-aminopropyltriethoxysilane | 1.2 | 400 | 40 | 9.6 | 4.6 | 0.48 | 17.3 |
| 9 | PFA | 3-aminopropyltriethoxysilane | 1.2 | 300 | 40 | 9.7 | 4.8 | 0.49 | 16.2 |
| 10 | FEP | 3-aminopropyltriethoxysilane | 1.2 | 320 | 40 | 9.6 | 4.8 | 0.50 | 18.4 |
| 11 | PI | N-2-(Aminoethyl)-3-aminopropylmethyldimethoxysilane | 6 | 280 | 40 | 1.3 | 4.7 | 3.62 | 5.1 |
| 12 | PET | N-2-(Aminoethyl)-3-aminopropylmethyldimethoxysilane | 6 | 170 | 40 | 1.6 | 4.6 | 2.88 | 6.3 |
| 13 | PTFE | 3-aminopropyltriethoxysilane | 6 | 360 | 40 | 1.8 | 4.6 | 2.56 | 7.1 |
| 14 | PFA | 3-aminopropyltriethoxysilane | 6 | 260 | 40 | 1.3 | 4.2 | 3.23 | 6.2 |
| 15 | FEP | 3-aminopropyltriethoxysilane | 6 | 280 | 40 | 1.2 | 4.1 | 3.42 | 7.2 |
| 16 | PI | | 6 | 320 | 40 | 4.1 | 0 | 0 | 6.5 |

TABLE 1-continued

| No. | Base film material | Coupling agent | Pressure (MPa) | Heating temperature (° C.) | Pressing time (min) | Amount of N present (atomic %) | Amount of Si present (atomic %) | Amount of Si present/ Amount of N present | Peel strength (N/cm) |
|---|---|---|---|---|---|---|---|---|---|
| 17 | PET | | 6 | 210 | 40 | 4.1 | 0 | 0 | 7.7 |
| 18 | PTFE | | 6 | 400 | 40 | 4.2 | 0 | 0 | 5.8 |
| 19 | PFA | | 6 | 300 | 40 | 4.3 | 0 | 0 | 6.2 |
| 20 | FEP | | 6 | 320 | 40 | 4.4 | 0 | 0 | 7.3 |
| 21 | PI | 3-glycidoxypropyltriethoxysilane | 6 | 320 | 40 | 0 | 4.2 | — | 0.2 |
| 22 | PET | 3-glycidoxypropyltriethoxysilane | 6 | 210 | 40 | 0 | 4.3 | — | 0.3 |
| 23 | PTFE | 3-glycidoxypropyltriethoxysilane | 6 | 400 | 40 | 0 | 4.2 | — | 0.2 |
| 24 | PFA | 3-glycidoxypropyltriethoxysilane | 6 | 300 | 40 | 0 | 4.1 | — | 0.1 |
| 25 | FEP | 3-glycidoxypropyltriethoxysilane | 6 | 320 | 40 | 0 | 4.6 | — | 0.4 |

[Evaluation Results]

The results in Table 1 show that the presence of nitrogen on surface of a base film significantly improves the adhesion strength between the base film and the copper foil and that an increase in the amount of this nitrogen present improves the adhesion strength.

Specifically, the results show that Nos. 21 to 25 of Comparative Examples, in which nitrogen is not present, exhibit a very low peel strength of 0.4 N/cm or less, whereas Nos. 1 to 20 of Examples, in which the amount of nitrogen present per unit area is 1 atomic % or more, exhibit a significantly high peel strength of 5.1 N/cm or more. Regarding the substrates for printed circuit boards of Nos. 1 to 5, Nos. 6 to 10, and Nos. 11 to 15, comparing the substrates respectively including the same base film, it is found that with an increase in the amount of nitrogen present, the adhesion strength improves.

Comparing Nos. 1 to 5 and Nos. 6 to 10, it is found that Nos. 6 to 10, in which the pressure during hot pressing is 1.2 MPa, each have a larger amount of nitrogen present and a higher peel strength than Nos. 1 to 5, in which the pressure during hot pressing is 6.0 MPa. The reason for this is believed to be as follows. An increase in the pressure during hot pressing increases the shear stress applied in the plane direction at the interface between the base film and the copper foil, and therefore, in Nos. 1 to 5, a satisfactory bonding state between the base film and the copper foil could not be maintained during hot pressing.

Comparing Nos. 1 to 5 and Nos. 11 to 15, it is found that Nos. 1 to 5, in which the heating temperatures during hot pressing are 40° C. higher than those in Nos. 11 to 15, respectively, each have a larger amount of nitrogen present and a higher peel strength than Nos. 11 to 15. These results show that the amount of nitrogen present can be adjusted by controlling the temperature during hot pressing.

The results of Nos. 21 to 25 show that even when silicon is present, the silicon does not contribute to the improvement in the adhesion strength in the case where nitrogen is not present. In contrast, comparing Nos. 1 to 5 and Nos. 16 to 20, Nos. 1 to 5, in which silicon is present, each have a higher peel strength than Nos. 16 to 20 though Nos. 1 to 5 and Nos. 16 to 20 have substantially the same amount of nitrogen present. There results show that silicon does not contribute to the improvement in the adhesion strength unless nitrogen is present, whereas the presence of silicon contributes to the improvement in the adhesion strength when nitrogen is present.

REFERENCE SIGNS LIST

| 1 | base film | 2 | metal layer | 10 | resist |
| 11 | metal pattern | S | coupling agent | | |

The invention claimed is:

1. A substrate for a printed circuit board, comprising a base film; and a metal layer disposed on at least one of surfaces of the base film,
   wherein an amount of nitrogen present per unit area, the amount being determined on the basis of a peak area of a N1s spectrum in XPS analysis of a surface of the base film exposed after removal of the metal layer by etching with an acidic solution, is 1 atomic % or more and 10 atomic % or less,
   wherein an amount of silicon present per unit area, the amount being determined on the basis of a peak area of a Si2p spectrum in XPS analysis of the exposed surface of the base film, is 1 atomic % or more and 10 atomic % or less,
   wherein a ratio of the amount of silicon present per unit area to the amount of nitrogen present per unit area of the exposed surface of the base film is 4 or less,
   wherein a surface of the metal layer, the surface being disposed on the base film side, has a ten-point average roughness Rz of 0.01 μm or more and 5.0 μm or less,
   wherein the base film contains a fluororesin as a main component, and
   wherein the fluororesin is tetrafluoroethylene-hexafluoropropylene copolymers (FEP), polytetrafluoroethylene-perfluoroalkyl vinyl ether copolymers (PFA), or polytetrafluoroethylene (PTFE).

2. The substrate for a printed circuit board according to claim 1, wherein a coupling agent containing nitrogen or a group derived from the coupling agent is present in the vicinity of an interface between the base film and the metal layer.

3. The substrate for a printed circuit board according to claim 2, wherein the coupling agent is a silane coupling agent.

4. The substrate for a printed circuit board according to claim 1,
   wherein the amount of nitrogen present per unit area, the amount being determined on the basis of a peak area of a N1s spectrum in XPS analysis of the exposed surface of the base film is 3 atomic % or more and 10 atomic % or less.

5. The substrate for a printed circuit board according to claim 1, wherein the ratio of the amount of silicon present per unit area to the amount of nitrogen present per unit area of the exposed surface of the base film is 0.1 or more and 1.5 or less.

6. The substrate for a printed circuit board according to claim 1, wherein a silane coupling agent containing nitrogen or a group derived from the silane coupling agent is present in the vicinity of an interface between the base film and the metal layer, wherein the nitrogen forms a C—N bond with carbon in a resin constituting the base film.

7. A printed circuit board comprising a base film; and a metal pattern disposed on at least one of surfaces of the base film, wherein an amount of nitrogen present per unit area, the amount being determined on the basis of a peak area of a N1s spectrum in XPS analysis of a surface of the base film exposed after removal of the metal pattern by etching with an acidic solution, is 1 atomic % or more and 10 atomic % or less, wherein an amount of silicon present per unit area, the amount being determined on the basis of a peak area of a Si2p spectrum in XPS analysis of the exposed surface of the base film, is 1 atomic % or more and 10 atomic % or less, wherein a ratio of the amount of silicon present per unit area to the amount of nitrogen present per unit area of the exposed surface of the base film is 4 or less, wherein a surface of the metal layer, the surface being disposed on the base film side, has a ten-point average roughness Rz of 0.01 μm or more and 5.0 μm or less, wherein the base film contains a fluororesin as a main component, and wherein the fluororesin is tetrafluoroethylene-hexafluoropropylene copolymers (FEP), polytetrafluoroethylene-perfluoroalkyl vinyl ether copolymers (PFA), or polytetrafluoroethylene (PTFE).

* * * * *